United States Patent [19]

Lang et al.

[11] Patent Number: 4,836,107
[45] Date of Patent: Jun. 6, 1989

[54] ARRANGEMENT OF MODULAR SUBASSEMBLIES

[75] Inventors: Bernhard Lang, Feucht; Matthias Selders, Ruckersdorf, both of Fed. Rep. of Germany

[73] Assignee: Diehl GmbH & Co., Nuremberg, Fed. Rep. of Germany

[21] Appl. No.: 116,046

[22] Filed: Nov. 2, 1987

[30] Foreign Application Priority Data

Nov. 24, 1986 [DE] Fed. Rep. of Germany ....... 3640099

[51] Int. Cl.$^4$ .................. F42C 19/06; H01R 23/68
[52] U.S. Cl. .................. 102/293; 102/206; 361/413; 439/50
[58] Field of Search ............... 102/293, 200, 201, 206; 361/412, 413; 439/44, 45, 50

[56] References Cited

U.S. PATENT DOCUMENTS

| | | | |
|---|---|---|---|
| 2,976,806 | 3/1961 | Risk et al. | 102/293 |
| 3,596,140 | 7/1971 | Walsh | 317/101 DH |
| 4,051,414 | 9/1977 | Will et al. | 102/293 |
| 4,391,195 | 7/1983 | Shann | 102/201 |
| 4,414,901 | 11/1983 | Sellwood | 102/206 |
| 4,479,417 | 10/1984 | Billard et al. | 102/200 |

FOREIGN PATENT DOCUMENTS

| | | |
|---|---|---|
| 2640973 | 9/1976 | Fed. Rep. of Germany . |
| 8422793 | 7/1984 | Fed. Rep. of Germany . |
| 8519788 | 7/1985 | Fed. Rep. of Germany . |
| 591132 | 6/1977 | Switzerland . |

OTHER PUBLICATIONS

Elektronik 1980, Fehlertolerantes, verteiltes Prozessrechnersystem mit Lichtleiterbus, 1980, pp. 27–37.

Primary Examiner—Charles T. Jordan
Attorney, Agent, or Firm—Scully, Scott, Murphy & Presser

[57] ABSTRACT

An arrangement of modular supporting structure or subassemblies constituted of interconnected circuit boards, especially for the assembly of a complex processing circuit in articles of ammunition possessing a search fuze or in airborne target-tracking bodies. The structures or modular subassemblies of the type considered herein consist of circuit boards arranged in a succession, in which between respectively two adjacent circuit boards, there are formed a series of optronic intersecting connections between coupling elements, wherein in the operational positioning of the circuit boards, a transmitting diode and a receiving detector are arranged opposite each other, which are connected with a multiplexer or, respectively, a demultiplexer.

11 Claims, 3 Drawing Sheets

ARRANGEMENT OF MODULAR SUBASSEMBLIES

BACKGROUND OF THE INVENTION

1. Field of the Invention

The present invention relates to an arrangement of modular supporting structure or subassemblies constituted of interconnected circuit boards, especially for the assembly of a complex processing circuit in articles of ammunition possessing a search fuze or in airborne target-tracking bodies.

2. Discussion of the Prior Art

Thus, for example, an arrangement of that type is known from the disclosure of U.S. Pat. No. 3,406,368. The structural components of a discrete integral circuit formation are operationally assembled on a circuit board, and the completion of the operational overall circuit is effected by the interconnection of the individual circuit boards through the intermediary of a motherboard through ohmic contacts which are located at the end surfaces of the circuit boards. For this purpose, in addition to the transmitting sections for operating voltages and for equilibrating the potential, there is in particular required an extremely large quantity of ohmic contacts for the numerous data connections, which extend between the individual supporting structures, (circuit boards) in a complex signal processing circuit.

An arrangement of modular supporting structures of that type for the implementation of complex signal processing circuits, in any event, is quite space-consuming and extremely susceptible to interferences in view of the presence of the multiplicity of necessary ohmic contact points. This is due to the fact that the functions of the contact paths are susceptible to chemical and mechanical environmental influences, such as depositions on the contacts and because of shocks. As a result, in actual practice, for such an assembly there are required considerable clamping forces for socket connectors or constructively complex mountings for contact points, which does not meet the demand for a simple exchangeability for individual modular supporting structures during the course of operational tests and repairs.

Especially when there is to be implemented a complex processing of data within the projectile of a weapon system, such as in ammunition possessing a search fuze or in a guided projectile or missile with an automatically-controlled search head, it is finally possible only with considerable constructive expenditure and corresponding spatial requirement, to so control the acceleration forces which are encountered at the start of the ammunition and during the flight into the target area, such that, if at all possible, there will not occur any failures or malfunctions in the data processing; for example, which are due to only transient disruptions or short-circuits in the connections between the individual modular supporting structures and their motherboard; in essence, between the individual modules of one group and their supporting structure carrier.

SUMMARY OF THE INVENTION

In recognition of these conditions, it is an object of the present invention to provide a modular support structure or arrangement of the type under consideration herein which, especially, even under extreme mechanical loads will be operationally-dependable and thereby miniaturizable, and which is easily serviced.

The foregoing object is inventively achieved in that the arrangement of supporting structures or modular subassemblies of the type considered herein consists of circuit boards arranged in a succession, in which between respectively two adjacent circuit boards, there are formed a series of optronic intersecting connections between coupling elements, wherein in the operational positioning of the circuit boards, a transmitting diode and a receiving detector are arranged opposite each other, which are connected with a multiplexer or, respectively, a demultiplexer.

The foregoing object is also essentially predicated on the construction of at least one serial optronic bus between the individual circuit boards of modular subassemblies, such that these can be directly positioned above each other in a compact, mechanically stable sandwich arrangement, and as a result thereof, during the course of this assembly, there is produced the optronic coupling. Because of the high optronically transmissible data rate, only a minimal number of data transmission paths are required between the individual circuit board planes of such an in-line circuit assembly; in principle, only a single path in each direction of transmission. In essence, the optronic data transmission is known per se; however, in the present invention, in contrast with currently applied technologies, there are eliminated the significant constructional and functional problems which are encountered in conjunction with the packaging between the socket modules and optic fibers; for example, as described in ELEKTRONIK 1980, Vol. 16, pages 27 et seq., especially lower right on page 33; or in German Pat. No. 26 40 973; inasmuch as there is provided a so-called free or unhindered, self-positioning optronic coupling location between respectively two superimposed circuit boards, which is effectuated during the course of the assembling together of these circuit boards and which will also not hinder any subsequent disassembling. Hereby, a few mechanical plug connections can be provided in a spatial proximity to this optronic connection, which will support the orientation during positioning, and in the final position represent a mechanical armoring or reinforcement; as a result of which these plug connections are preferably concurrently utilized for power transmission and potential connection between the individual planes or surfaces of the circuit boards. Independently thereof, or in addition thereto, there can be provided a positioning aid during the joining together of the optronic connection in the form of geometrically correlated radiation conductors (which can concurrently possess optical or lens functions) and/or in the form of plug sockets (which concurrently serve as a screening against environmental scatter radiation). Especially for mechanical, as well as for functional coupling between the planes of the circuit boards, can there be formed a hybrid plug connection, which is constituted of ohmic power plug connections and optronic data plug connections, with the dimensioning of the plug socket serving as positioning aids and for the load transmission under disruptive mechanical influences acting in the longitudinal and transverse directions of the plug connection. Inasmuch as there need no longer be encountered any friction forces for the optronic coupling (in conformance with ohmic plug connectors), there is obtained a considerably miniaturized, self-centering connection of intersecting locations with minimal plug forces; in essence, which is adapted at a high operational dependability for the highest transmission rates.

Additionally, in the inventive arrangement of modular subassemblies provision can be made that for the optimum utilization of the high data processing speed, which is given within the bounds of the serial intersecting connection, introduced between respectively two such optronic connections is a real-time information which can serve for the control and preparation of the data segments which are to be individually processed. In the interest of a practically undelayed introduction of real-time into all planes of the circuit boards of such a modular subassembly arrangement, the encoded real-time information is expediently transmitted as a pulse pattern through an optic or fiberglass conductor; an additional measure which also appears accessible to independent protection. Provided on each of the circuit boards coming into consideration herein, is a receiver in spatial proximity to the path of the fiberglass conductor, which is provided with a decoupling location for supplying the optronic receiver with the real-time pulse pattern.

BRIEF DESCRIPTION OF THE DRAWINGS

Reference may now be had to the following detailed description of exemplary embodiments of the invention, representative of additional alternatives and modifications, as well as further features and advantages of the invention, taken in conjunction with the accompanying generally schematic drawings; in which.

DETAILED DESCRIPTION

Figure 1:
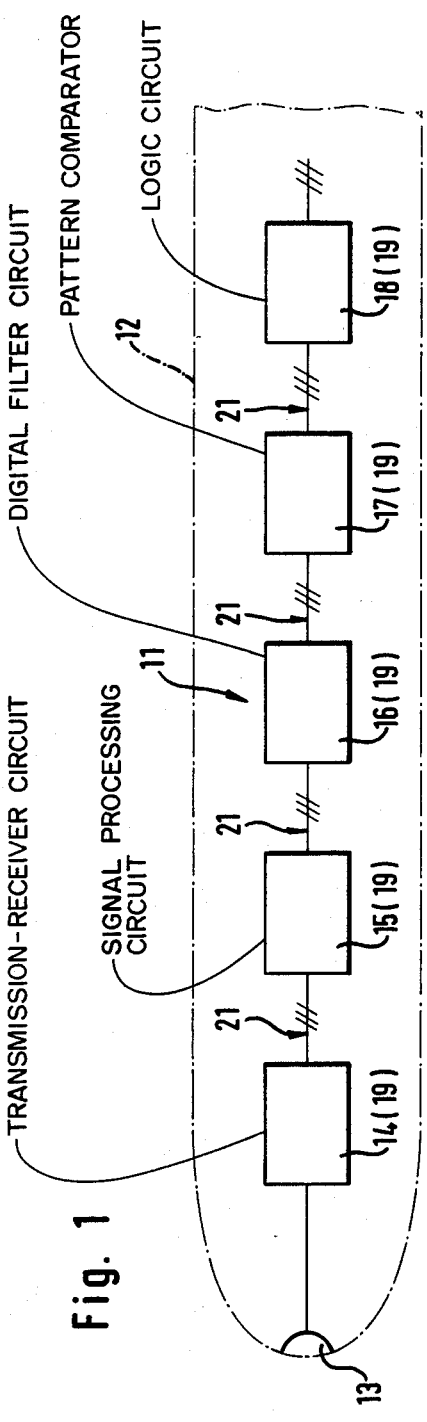
FIG. 1 illustrates a functional circuit block diagram representative of a usual, parallel-coupled chain of functional units for signal recovery and signal processing.

The signal processing circuit 11 which is shown in FIG. 1 as a circuit block diagram, for example, represents the radar channel of an airborne body 12 which is equipped with a search head, or an article of submunition possessing a search fuze. Connected thereto is the antenna 13 of a transmission-receiver circuit 14, which supplies a signal processing circuit 15 at the receiving end of the former. Following the circuit 15, for example, is a digital filter circuit 16 and a pattern comparator with a threshold step 17 for the actuation of a logic circuit 18 providing for the generation of guidance commands or for the emission of a trigger command.

In the interest of obtaining an operationally-dependent and easily serviceable assembly of a complex circuit 11 of that type, there is preferably effectuated that of the described functions (partial circuits 14 through 18) on a separate submodular assembly, which in the interests of obtaining a compact assembly, can be produced as a hybrid module 19 with a multi-layered circuit board 20 (shown in FIG. 3), or assembled from a group of such hybrid modules on a common support plate, or substrate. The complexity of the signal processing circuit 11, in addition to the electronic supply lines and the ground potential lines, also demands a large number of data lines extending between the successive circuits 14 through 18. Even at a skilled design for the functional subdivisions among the individual circuits 14 through 18, it is unavoidable that individual data lines will not be directly necessary between two successive partial circuits; but will bridge over a few of these partial circuits; such that in the interest of obtaining a monitorable apparative configuration which can be monitored, also this itself will be looped through with unnecessary data lines through the in between located individual circuits 14 through 18. Moreover, besides the main data flow direction, there are encountered oppositely-directed data flow directions, somewhat for the optimizing of parameters of functionally forwardly located circuit portions, in accordance with the measure of the processing results functionally further rearwardly located portions of the overall circuit 11. Between individual of the successive circuits 14 through 18 there must thus be presently formed a large number of physically parallel data connections 21, which in practice can be effectuated; for example, in the form of plug socket connections between the individual modules 19 and a central wiring plate or motherboard (not shown in the drawing). Such electro-mechanical (ohmic) multiple-connections are, however, not only expensive and place-consuming, but are particularly susceptible to disturbances or interferences caused by atmospheric and mechanical surrounding influences; and the data rate which is transmissible across ohmic contacts is relatively limited.

Figure 2:
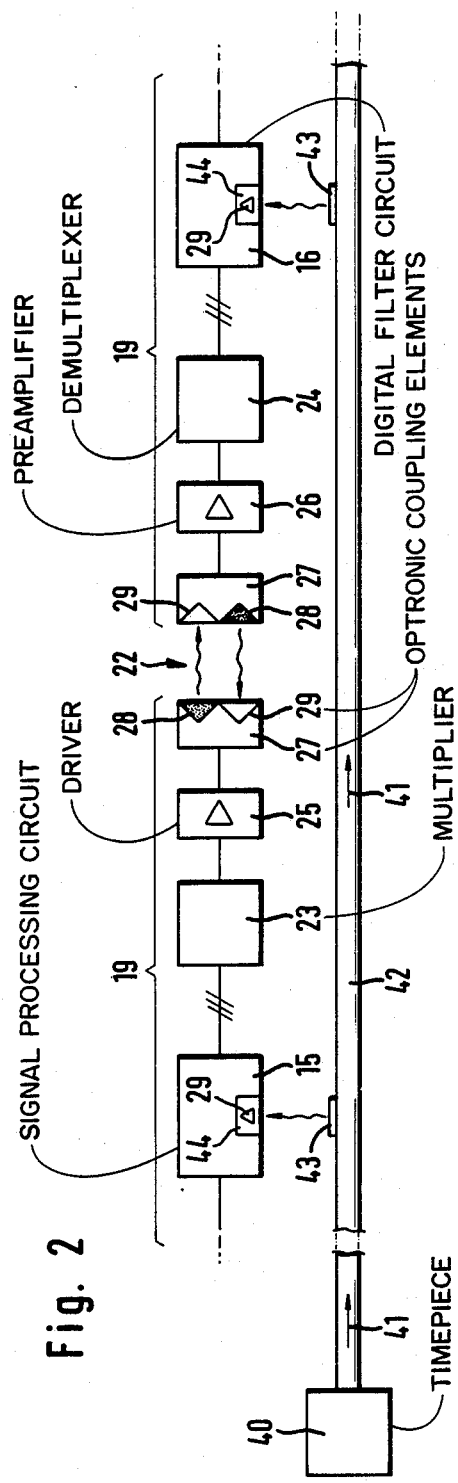
FIG. 2 illustrates a section of the operating chain of FIG. 1; however, with a serial optronic coupling between following functional blocks, pursuant to the present invention.

Consequently, pursuant to FIG. 2, provision is made that the electromechanical multiple-bus connection 21 between successive modules 19, after conversion of the data flow into a higher bit rate, are reduced to the lowest possible, in principle for each data transmission direction to only one, serial intersecting connection 22. In addition thereto, the individual module circuits, in the exemplary instance of FIG. 2, circuits 15 and 16, presently towards the intersecting connection 22; in effect, at the output and input ends, towards parallel-series conversion and for series-parallel reconversion have a multiplexer or, respectively, demultiplexer 24 connected thereto, which actuate or are actuated by rapid optronic coupling elements 27, through a driver 25 or, respectively a preamplifier 26. For example, the coupling elements relate, at the transmission end, to cooled laser diodes or, preferably, to rapid infrared diodes 28 (for example, LED "LDT-30002" produced by Laser Components, Grobenzell, West Germany), and at the receiving end to optronically actuatable field-effect transistors or Silicon-PIN-Detectors (for example, P-Diode "S181P" produced by Telefunken Electronic), which distinguish themselves mechanically through small dimensions and a high degree of insensitivity with regard to disruptive environmental influences, as well as, electronically, through short response periods. In the normal instance, for each data transmission direction, one serial intersecting connection 22 is adequate, thus, between two successive circuit modules 19, in the transmitting direction as well as in the receiving direction, there is respectively provided a diode detector combination 28, 29/29, 28. However, in extreme instances, the data rate which is to be transmitted can become so high as to reach the functional limitations of the parallel-series conversion or of the inherently extremely rapid optronic connections 22; in this case, there must be effectuated, in the applicable direction, a plurality of such serial connections 22 adjacent each other, whereby their quantity is still always extremely low in comparison with that of the data channels in the usual parallel data connections 21 (FIG. 1).

Expediently, from an apparatus standpoint, the driver 25 and its multiplier 23, or respectively the preamplifier 26 and its demultiplexer 24, and if possible additionally also the applicable optronic coupling elements 27, can be combined into a hybrid subassembly or sub-module 30 (FIG. 3), and for example, through the intermediary of a subsidiary plate 31 mounted on the associated circuit board module 20 in addition to the remaining modular structural elements 32; in effect, electrically connected to the functionally associated conductive paths on the applicable module 19. Through the mutually oppositely located positioning of the two subassemblies or modules 30 there is obtained the intersecting connection 22, when the applicable circuit boards 20 are mounted above each other in their final assembled sandwich position. As a positioning aid and safety, in proximity to the applicable module or element grouping 30 there can be inserted a socket pin-socket plug connection 32. This can be simultaneously formed as a potential connection or as an operating voltage coupling, and can thereby be connected through its sleeve 33 or through its pin 34, with applicable conductor path planes present in the associated circuit board 20.

Instead thereof or in addition thereto, it is possible to carry out a securing of the appropriate orientation between the transmitting and receiving coupling elements 27 through a form-fitted engagement between the enclosures for the transmitting diode 28 and the associated receiving detector 29. In the embodiment pursuant to FIG. 3, these optronic active elements 28, 29 are set back from the plane of the coupling elements 27, so as to enable the positioning of a radiation conductor 35 therebetween. This radiation conductor 35, a somewhat short cylinder constituted of a material which is conductive over the spectrum of the optronic connection, serves for the exchangeable positioning, as well as for an avoidance of scatter radiation from this connection 22 into the environment; in effect, as a screening against environmental scatter radiation. In a configuration with convex end surfaces 36, in the interest of obtaining a high degree of efficiency for the optronic connection 22, the radiation conductor 35 additionally serves as a collector lens.

Figure 3:
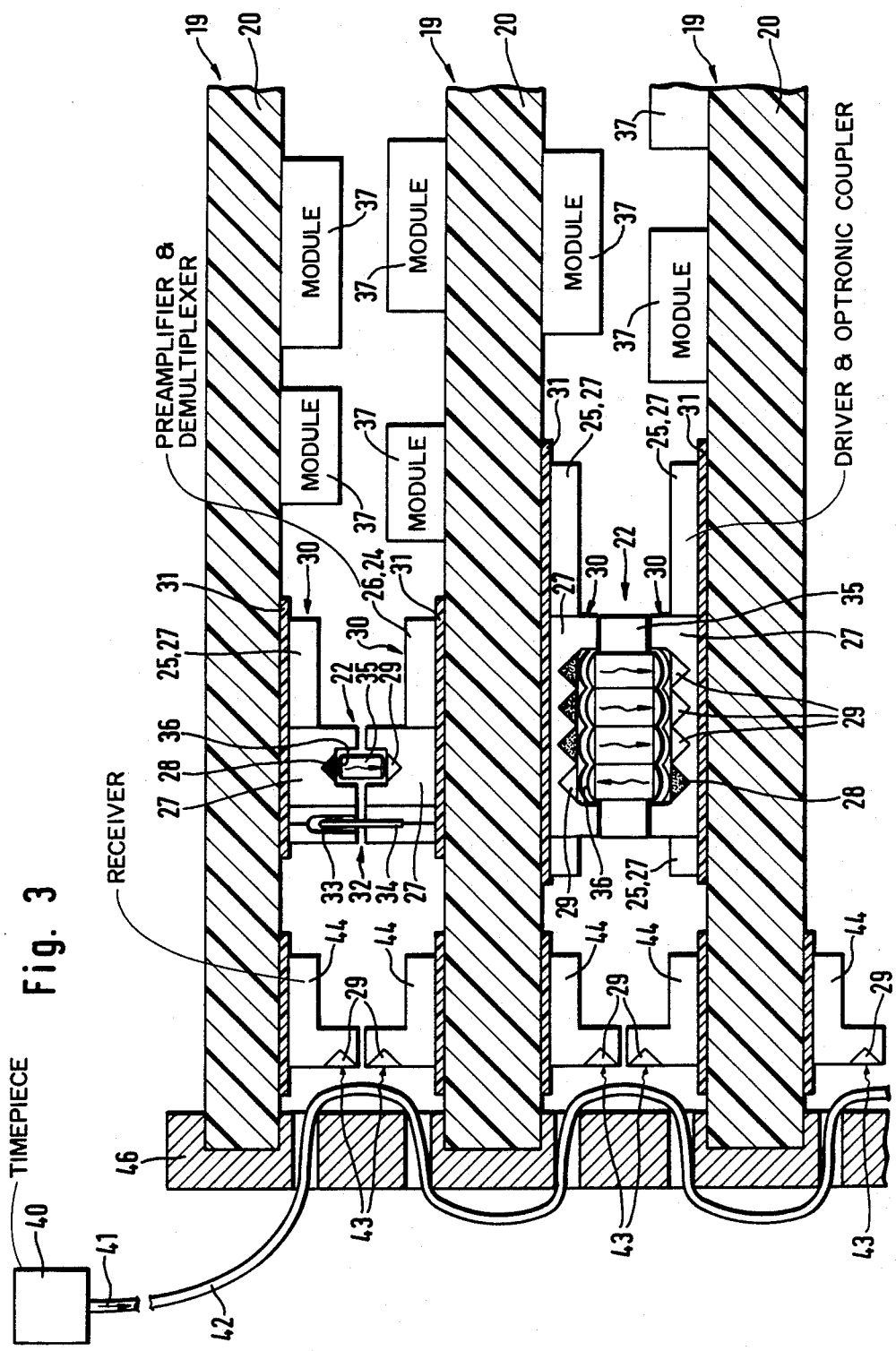
FIG. 3 illustrates a multi-plane circuit board arrangement with differently configured serial optronic couplings partly arranged in parallel groups, between the individual positions of a circuit board sandwich arrangement.

In the embodiment which is illustrated in the lower portion of FIG. 3, the optronic connection 22 consists of a plurality of channels; in this instance of three transmitting channels leading to the immediately lower positioned circuit board 20 and one receiving channel therefrom. Correspondingly, for the one circuit board 20, a plurality of transmitting diodes 28 in addition to a receiving detector 29, and oppositely located a receiving detector 29 in addition to a plurality of transmitting diodes 28, are assembled into the applicable optronic coupling elements 27. The radiation conductor 35, which concurrently serves for the mechanical orientation between the coupling elements 27, is then clamped as a plate between the elements 27, and on its end surfaces 36 the arrangement of the diodes and detectors 28, 29 are correspondingly equipped with a plurality of lens-shaped protuberances.

Figure 4:
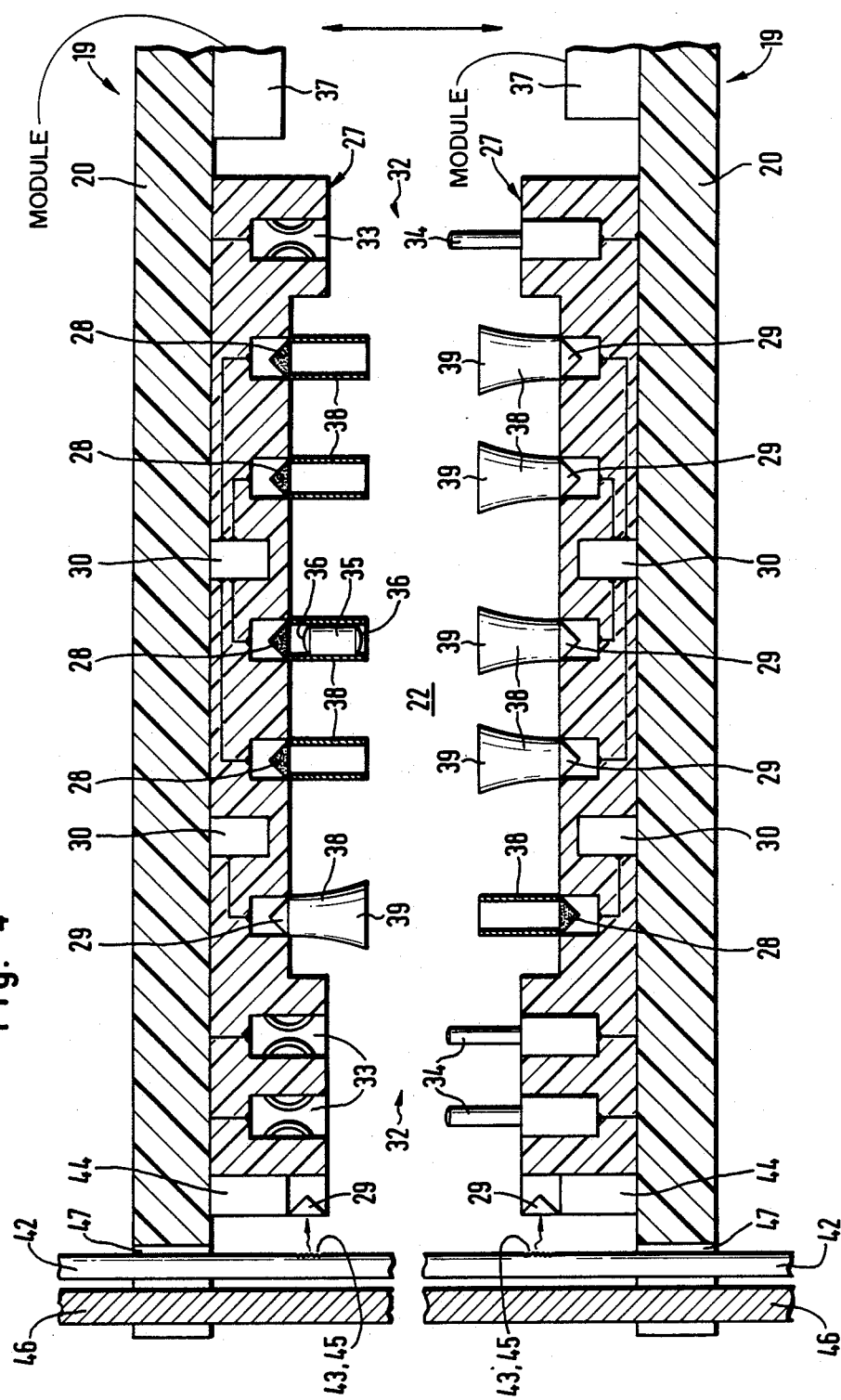
FIG. 4 illustrates an embodiment of the coupling in the form of a hybrid bus plug with ohmic and optronic coupling elements located between the plane of two sequentially arranged circuit boards.

In the embodiment pursuant to FIG. 4, the pair of coupling elements 27—27 encompass, between two successive circuit boards 20, 20, a plurality of ohmic plug connections 32 in addition to a plurality of optronic connections 22.

As before, these mechanical plug connections 32 serve, in the same manner, for the exchangeable positioning as well as for the energy transmission and potential connection between the successive planes of the circuit boards 20. The optronic connections 22 are similarly configured in the shape of plug sockets, in which there are respectively arranged the transmitting diodes 28 and the receiving detectors 29 are respectively arranged at the base of a tube 38. The internal and, respectively, external dimensions oppositely located tubes 28 are so selected that these will engage pairwise into each other in order to axially orient the applicable path of the radiation transmission. Additionally, in the inwardly located tube 38, there can be arranged a rod-shaped radiation conductor 35 which is profiled as a thick lens which, when the tubes 38, 38 are inserted into each other, essentially bridges over the distance between a transmitting diode 28 and the oppositely located receiving detector 29. In order to render easier the insertion of the tubes 38 into each other, and thereby their guiding function during environmental or manufacturing encountered offset, the free end surface of the inwardly located tube 38 is generally conically reducing and/or, preferably, the presently externally located tube 38, as indicated in FIG. 4, in a tulip or funnel-shaped broadening 39.

When the optronic intersecting connections 22 also distinguish themselves through an extremely high transmission speed, then physically required for each serial transmission sequence, there is necessary a certain time interval. Even then, when an information is only looped through a module 19; in effect, across a plane of circuit boards 20, inasmuch as it is only processed in another module 19, in accordance with the extent of the parallel-series conversion and reconversion for each intersecting connection 22, and for the optronic transmission across this connection 22, a certain delay period is passed through between the preparation of an information in one module 19 and the availability of this information for data processing in another module 19.

In the interest of obtaining a high data processing speed, the processing is, however, preferably not effected in a fixed synchronous raster or pattern, but at the presence of all informations which are required for the processing. In order to ensure that from the successively incoming informations only mutually associated informations are subjected to a predetermined processing operation, and can be prepared for a defined interrogating timepoint, it is expedient to introduce a real-time information to each module 19, and thereby in each plane of the circuit boards 20, by means of a rapid data transmission connection, to which information there can be oriented a data association and a data preparation. Pursuant to FIG. 2 through FIG. 4, this introduction of real-time information is effected from a from a timepiece 40, which (comparable to the German normal time from the PTB, available by radio) emits a pulse pattern 41 as a continually encoded time information. This pulse pattern 41 is now transmitted through a fiberglass conductor 42 to all modules 19 which come into consideration; in essence, to the circuit boards 20; whereby, deviating from the basic representation in the drawing, there can also be constructed a star-shaped network of fiberglass conductors 42 extending towards spatially differently grouped modules 19. At decoupling locations 43, the real-time information; in essence, the light pulse pattern 41, is transmitted to a receiver 44 possessing a receiving detector 29, so as to be decoded therein and then conducted to the individual modular elements 37 as control information. Although for both sides of a circuit board 20 a single receiver 44 would basically be sufficient, there are obtained simpler wiring junctures and overall easier survaillable conditions when each surface of circuit boards 20 which is provided for equipping thereof with modules or structural elements 37, is equipped with its own receiver 44, as is considered in FIG. 3 of the drawings.

Expediently, the receivers 44 are arranged at the edge of each of the circuit boards 20, so as to merely require the conveyance of the fiberglass conductor 42 from there in front of the receiving detectors 29. The decoupling location 43 can be simply implemented in that the jacket surface of the fiberglass conductor 42, presently opposite a receiving detector 29 is coated with a rough lacquer layer, or is imparted a mechanical roughing 45. In the actual constructive embodiment pursuant to FIG. 3, the fiberglass conductor 42 meanders through an enclosure 46 in the circuit boards so as to be displaced into the respective interspaces of the circuit boards, whereas in the constructional embodiment pursuant to FIG. 4, the fiberglass conductor 42 extends axially-parallel to the succession of the circuit boards for transmission of the real-time information, namely inserted laterally into radial circuit board slots 47 and then outwardly fixed in position through the enclosure 46.

What is claimed is:

1. A compact arrangement of modular subassemblies of mutually interconnected circuit boards, especially for the assembly of a complex signal processing circuit in ammunition equipped with search fuzes or in airborne target-tracking bodies; the improvement comprising in that said circuit boards are arranged in succession; optronic serial intersecting connections being formed between coupling elements intermediate respectively two successive of said circuit boards, in the functional positioning of said circuit boards a transmitting diode and a receiving detector being respectively arranged opposite each other, and which are respectively connected to a multiplexer and to a demultiplexer.

2. A modular arrangement as claimed in claim 1, wherein, respectively, a hybrid coupling element including a multiplexer, a driver, a transmitting diode or multiplexer, a preamplifier and receiving detector are arranged as a sub-modular subassembly on one said circuit board.

3. A modular arrangement as claimed in claim 1, wherein a radiation conductor is arranged in said optronic connection.

4. A modular arrangement as claimed in claim 3, in which the radiation conductor is constituted of a focusing member.

5. A modular arrangement as claimed in claim 3, wherein said radiation conductor comprises a centering member between coupling elements associated with each other.

6. A modular arrangement as claimed in claim 5, wherein an adjusting pin is provided for each said associated coupling element.

7. A modular arrangement as claimed in claim 6, wherein the adjusting pin is a component of an energy or grounding plug connection.

8. A modular arrangement as claimed in claim 1, wherein the transmitting diodes and receiving detectors are each arranged within a projecting tube.

9. A modular arrangement as claimed in claim 8, wherein the oppositely positioned tubes are insertably engageable in each other.

10. A modular arrangement as claimed in claim 1, wherein sleeves and pins of ohmic socket plug connections and tubes for electronic couplings elements are combined into a hybrid socket plug element.

11. A modular arrangement as claimed in claim 1, wherein radiation receivers are arranged on the circuit boards, at least one fiberglass conductor being conducted past said radiation receivers, said conductor being equipped with decoupling locations in the region of associated of said receivers.

* * * * *